United States Patent [19]

Maruyama et al.

[11] Patent Number: 4,809,430
[45] Date of Patent: Mar. 7, 1989

[54] METHOD AND APPARATUS FOR MOUNTING ELECTRONIC PARTS

[75] Inventors: Masahiro Maruyama, Mino; Kanji Hata, Katano; Eiji Itemadani, Sakai; Masao Iritani, Neyagawa, all of Japan

[73] Assignee: Matsushita Electric Industrial Co., Ltd., Kadoma, Japan

[21] Appl. No.: 60,565

[22] Filed: Jun. 11, 1987

[30] Foreign Application Priority Data

Jun. 12, 1986 [JP] Japan .................................. 61-136586

[51] Int. Cl.$^4$ .......................................... H05K 13/04
[52] U.S. Cl. ........................................ 29/834; 29/712; 29/739
[58] Field of Search ................. 29/832, 834, 709, 712, 29/714, 739

[56] References Cited

U.S. PATENT DOCUMENTS 4,631,816 12/1986 Fujita et al. .................... 29/840 X Primary Examiner—Timothy V. Eley
Assistant Examiner—Taylor J. Ross
Attorney, Agent, or Firm—Cushman, Darby & Cushman

[57] ABSTRACT

In the mounting of an electronic component, a holding member is rotated by a predetermined angle prior to actual holding of the electronic parts, thereby to detect a center of the holding member from at least two positions of the rotation angle, and the rotation center of the holding member is found by a calculation based on the detected center of the holding member. The position of the electronic parts against a circuit board then is corrected on the basis of a deviation between the position of the rotation center and the center of the holding member.

2 Claims, 7 Drawing Sheets

METHOD AND APPARATUS FOR MOUNTING ELECTRONIC PARTS

FIELD OF THE INVENTION AND RELATED ART STATEMENT

1. Field of the Invention

The present invention relates generally to a method for mouting small components such as electronic parts, and more particularly to a method for correcting displacement of the parts which are mounted at a predetermined position of a circuit board in an automatic parts mounting apparatus.

2. Description of the Related Art

In the known method for mounting an electronic part in an automatic parts mounting apparatus, a part is sucked with a suction disposed on a mounting head, and a deviation of the position of the part from a correct position is detected by a part detecting device. Then, the deviation of the postion is corrected on the basis of information from the parts detecting device, and the part is correctly mounted at a predetermined position of a circuit board. In mounting of the parts, the mounting head or the circuit board is mounted on a positioning table which is movable in an X-Y plane, and the mounting head is positioned at the predetermined position of the circuit board. In the above-mentioned method, correction of the deviation is accomplished by moving the mounting head or the positioning table.

On the other hand, when the parts are mounted on the circuit board, sometimes the parts are required to turn 90° or 180°, for example, with respect to a first sucked position. For the above-mentioned purpose, a mounting head which is provided with such a rotation suction is known. However, in the mounting head having rotatable suction, eccentricity of the rotation center of the suction with respect to the axis of the suction is caused, and the amount of the eccentricity is estimated to be 20–100 microns. Hence, when the suction is rotated in order to turn the parts, the position of the parts sucked on the suction deviate from the predetermined position.

OBJECT AND SUMMARY OF THE INVENTION

An object of the present invention is to provide a method for mounting an electronic part which is capable of correcting for a deviation of position of the electronic parts due to eccentricity of a rotating member of the suction component.

The method for mounting electronic parts in accordance with the present invention comprises the steps of:
 holding an electronic part with a holding member,
 rotating the holding member by a predetermined angle,
 detecting at least two positions of the center of the holding member by after rotation by the predetermined angle,
 calculating a rotation center of the holding member on the basis of the at least two positions of the center and the predetermined rotating angle of the holding member, and
 correcting a mounting position of the electronic part onto a circuit substrate on the basis of the deviation between the center and the calculated rotation center of the holding member.

DESCRIPTION OF THE PREFERRED EMBODIMENTS

Figure 4:
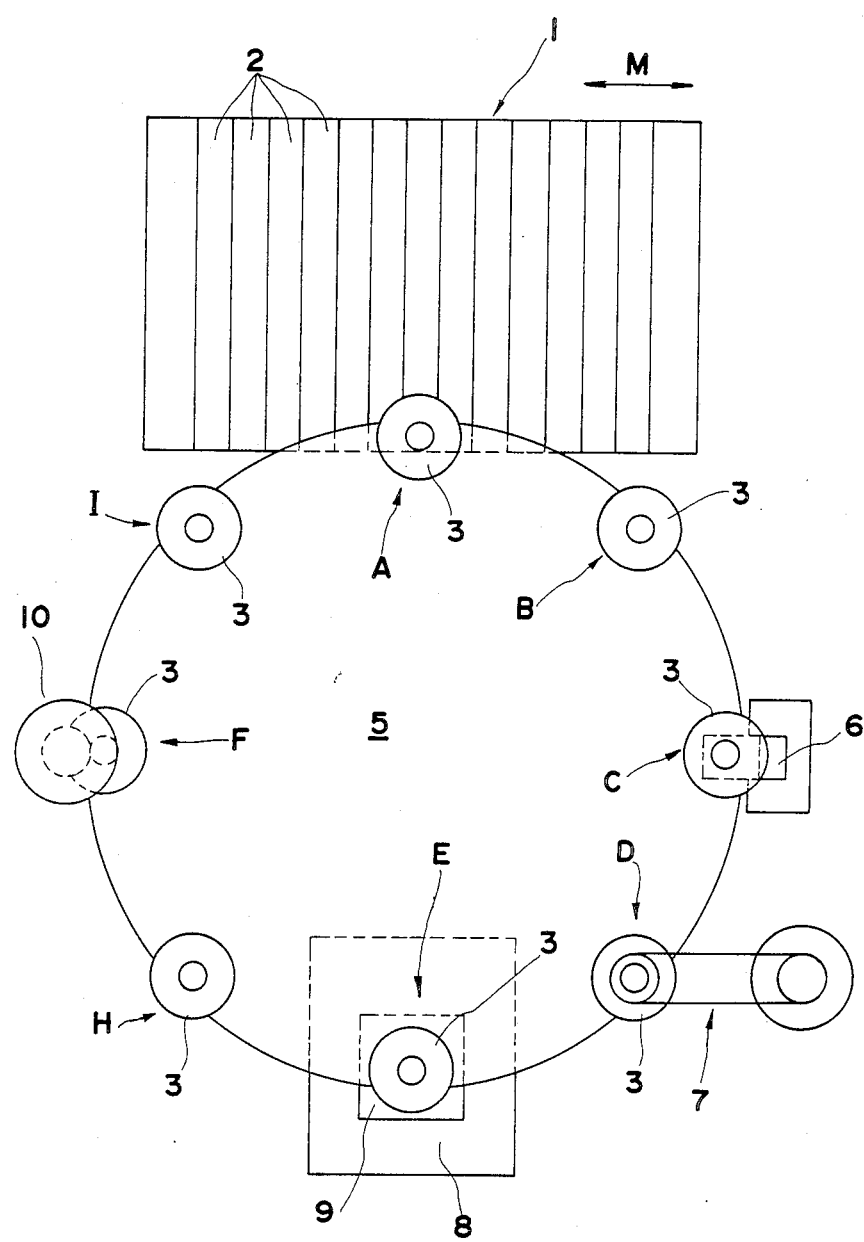
FIG. 4 is a plan view of an apparatus for embodying the method for mounting electronic parts in accordance with the present invention.
Figure 5:
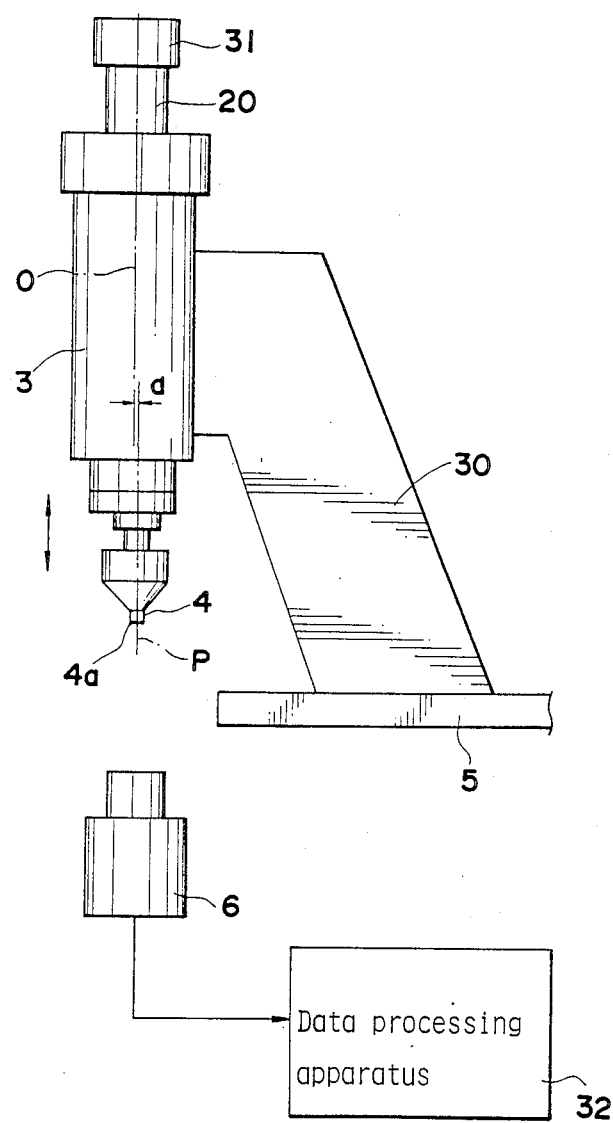
FIG. 5 is a side view of a mounting head staying on a part detecting device.

The configuration of a part mounting apparatus embodying the method in accordance with the present invention is shown in FIG. 4. Referring to FIG. 4, a part supplying portion 1 is provided with a plurality of parts supplying cassettes 2 which are parallelly arranged, and which are to be moved in a direction as shown by arrow M. The respective parts supplying cassettes 2 store a lot of electronic parts which are placed on a tape-shaped holding member at equal intervals. When a predetermined electronic part is taken out from the casette, the parts supplying portion 1 is moved so that the cassette storing the predetermined electronic parts is positioned at a part pickup station A. As shown in FIG. 5, a suction 4 which is disposed on the mounting head 3 is moved downward by pushing at an upper portion 31 and sucks the electronic parts.

Eight mounting heads 3 are disposed on a circumferential portion of a rotary table 5 at equal intervals in the embodiment as shown in FIG. 4. The rotary table 5 intermittently rotates and stops every 45°. The respective mounting heads 3 pass via the parts pickup station A, a part position adjusting station B, a part detecting station C, a part direction adjusting station D, a part mounting station E and a mounting head return station F by rotation of the rotary table 5.

The operation of the mounting head now is elucidated referring to FIG. 4. At first, the suction 4 of the mounting head 3 which is positioned at the parts pickup station A is moved downward and picks up a part from the parts supplying cassette 2. Subsequently, the rotary table 5 turns by 45°, and the mounting head 3 sucking the parts with the suction 4 is positioned at the parts position adjusting station B. The position of the part which is sucked by the suction 4 is roughly adjusted by a mechanical adjusting member (not shown). The rotary table 5 then rotates by 45°, and the mounting head 3 is positioned at the parts detecting station C as shown in FIG. 5. At the parts detecting station C, the position of the part is detected by the parts detecting device 6 comprising a CCD camera or video camera, for example. After the detection of the position of the parts, the rotary table 5 rotates and the mounting head 3 is positioned at the parts direction adjusting station D. At the station D, a rotating device 7 rotates the suction 4 and changes the direction of the parts. A detailed constitution of the rotating device 7 is shown in FIG. 6.

Figure 6:
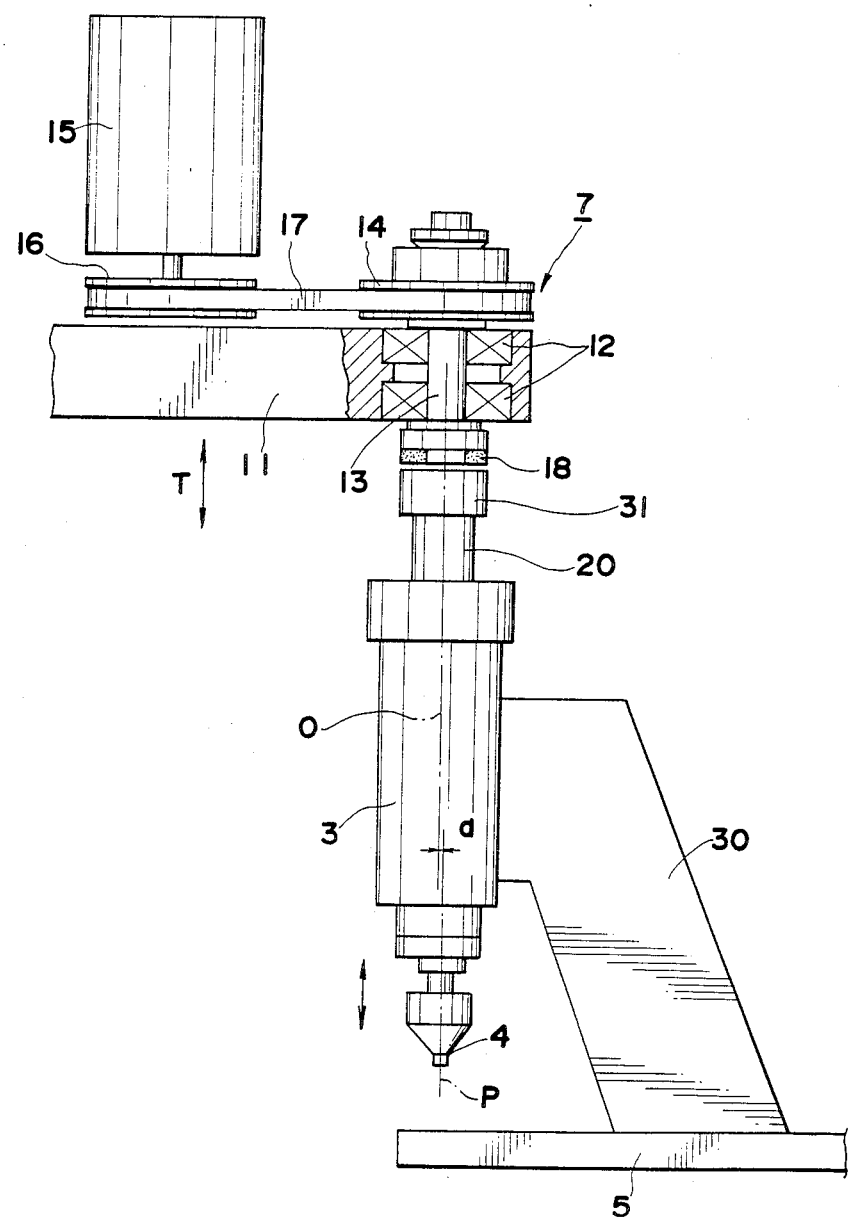
FIG. 6 is a side view of the mounting head and a rotating device which is shown in partial cross-section.

Referring to FIG. 6, the mounting head 3 is fixed on the rotary table 5 by a bracket 30. A shaft 20 which is provided with the mounting head 4 at the lower end thereof is inserted in the mounting head 3. The shaft 20 is movable up and down and rotatable in the mounting head 3. When the suction 4 picks up the parts at the parts pickup station A, an upper portion 31 of the shaft 20 is pushed down by a driving means (not shown). An arm 11 of the rotating device 7 is movable in a direction of an arrow T and provided with a clutch 18. The clutch 18 is supported by two bearings 12 to the arm 11 and is rotated by a driving motor 15 through two gears 14 and 16 which are linked by a timing belt 17. When the mounting head 3 is positioned under the rotating device 7 at the parts direction adjusting station D, the upper portion 31 of the shaft 20 is positioned under the clutch 18. When the shaft 20 is rotated in order to change the direction of the parts, the arm 11 of the rotating device 7 falls downward, and the clutch 18 contacts with the upper portion 31 of the shaft 20. Then the driving motor 15 rotates and the shaft 20 is rotated by the clutch and shaft 13, and the suction 4 sucking the parts is rotated. The driving motor 15 is a pulse motor, for example.

Subsequently, the rotary table 5 rotates by 45°, and the mounting head 3 is positioned at the parts mounting station E. A positioning table 8 is placed at the parts mounting station E and a circuit board 9 is mounted on the positioning table 8. The positioning table 8 is composed so as to be movable in X- and Y-directions in a plane which is parallel to the rotary table 5. Movement of the positioning table 8 is controlled by data of the parts detecting device 6. After the adjustment of the positioning table 8, the suction 4 is moved downward and the parts sucked by the suction 4 is mounted on the circuit board 9. Then the rotary table 5 rotates again by 45°, and the mounting head 3 arrives at an idle position H. When the mounting head 3 is positioned at the mounting head return station F by further rotation of the rotary table 5, the mounting head 3 is rotated by a driving device 10, and is reset to its original position. Then, the mounting head 3 is again positioned at the parts pickup station A via an idle station I by rotation of 90° of the rotary table 5.

Figure 1:
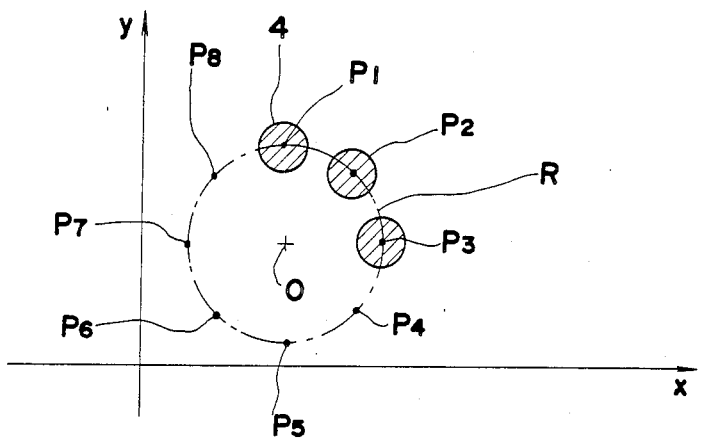
FIG. 1 is a graph showing a method for finding a rotation center of a suction in an embodiment of the present invention.

In the above-mentioned operation, a rotation center of the suction 4 of the mounting head 3 is detected by the parts detecting station prior to the parts mounting process. As shown in FIG. 5, the eccentricity d between a rotation center O and a center P of the suction 4 is estimated to be 20–100 microns in an actual apparatus. In order to detect the rotation center O of the suction 4, as shown in FIG. 1, the suction 4 is rotated at 45° internals, and points $P_1$–$P_8$ designating the center of suction 4 are detected by the parts detecting device 6 every 45°. When the eccentricity between the rotation center and the center of the suction 4 exists, an orbit of the respective points $P_1$–$P_8$ becomes circular, and the center of the orbit is a rotation center O of the suction 4. The rotation center O is found by detection of at least two center points of the suction 4 when the rotation angle is known.

Figure 7:
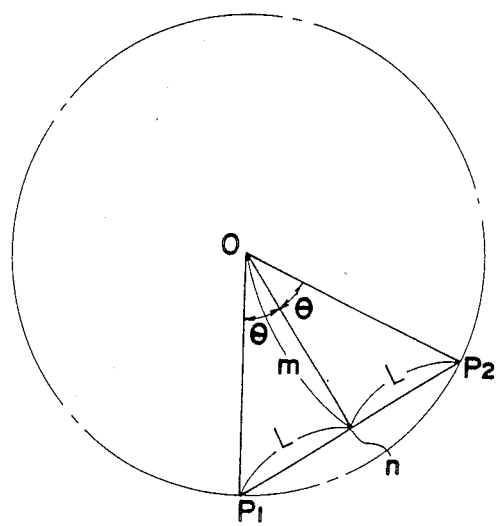
FIG. 7 is a figure showing a method for finding a rotation center on the basis of two positions.

Referring to FIG. 7, when two center positions $P_1$ and $P_2$ are detected and the rotating angle is shown by $2\theta$, a distance $\overline{P_1P_2}$ is divided in two parts, and a center of the distance $\overline{P_1P_2}$ is designated by n. When a distance $\overline{P_1n}$ is designated by L and a distance $\overline{On}$ is designated by m, the distance m is shown by the following equation:

$$\tan \theta = L/m$$
$$m = L/\tan \theta.$$

Therefore, the position of rotation center O is calculated by the equation. In case the rotation angle is not known, however, the rotation center may be found by detection of at least three center positions. Furthermore, in case the center of the suction 4 is detected at equal intervals, the rotation center O is found by calculation of an average thereof. Moreover, when the suction 4 is rotated by 180°, the rotation the center O is center of the two points.

The detailed operation of the embodiment is elucidated hereinafter.

At first, the first mounting head 3 is positioned at the parts detecting station C as shown in FIG. 5, and a sucking face 4a of the suction 4 is positioned over the parts detecting device 6. The parts detecting device 6, which comprises a video camera, detects an image of the sucking face 4a and outputs data of a center position of the sucking face 4a. The data is memorized in a memory of a data processing apparatus 32. Next, the rotary table 5 is rotated by 45°, and the first mounting head 3 is positioned under the parts direction adjusting station D. The suction 4 is rotated by 45° by the rotaing device 7 at the station. Then, the rotary table 5 rotates by 315°, whereby the first mounting head 3 is again positioned at the parts detecting station C. The sucking face 4a is detected by the parts detecting device 6, and data of the center position of the sucking face 4a is memorized in the memories of the data processing apparatus 32. The suction 4 is rotated by 360° in the above-mentioned manner, and the respective center positions of the sucking face 4a are detected and memorized in the data processing apparatus 32.

Figure 2:
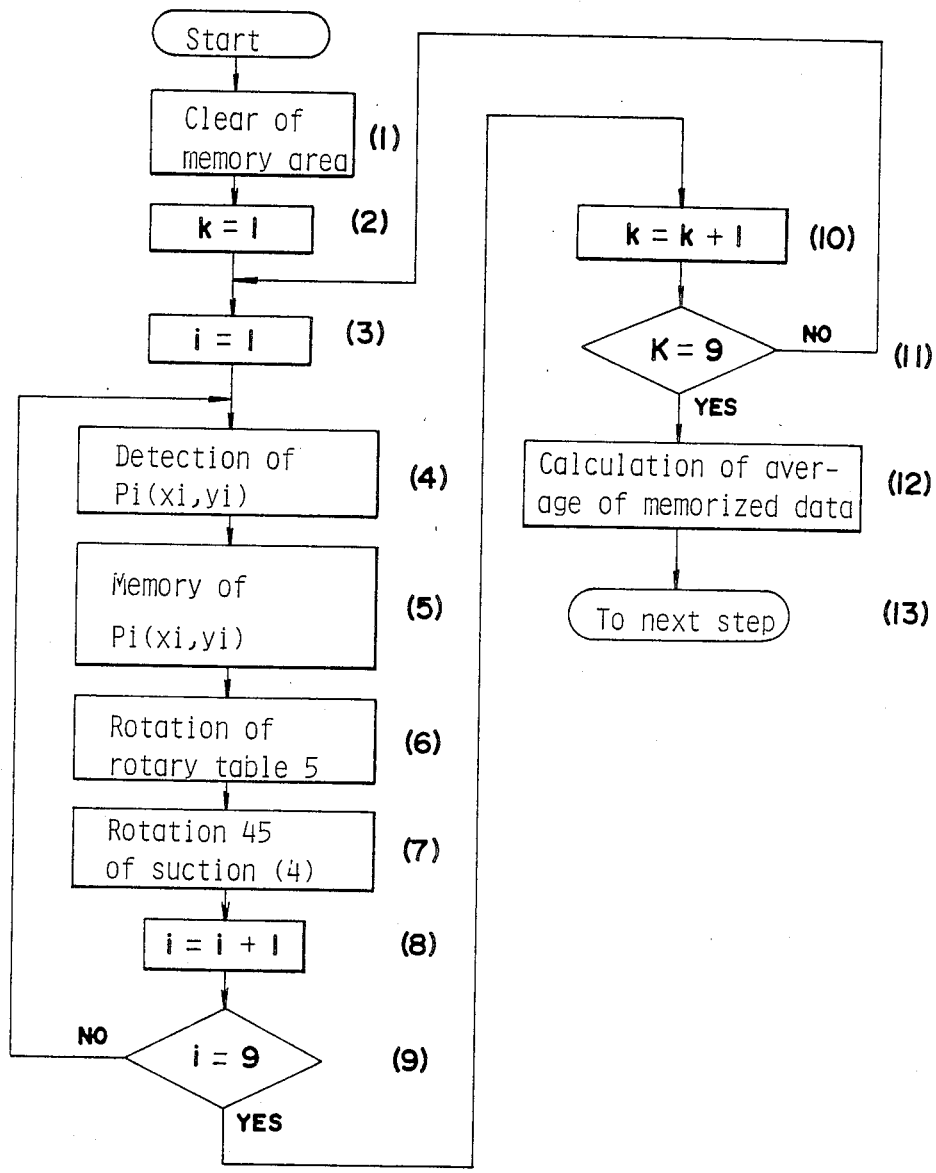
FIG. 2 is a flow chart showing operation of the embodiment.

Coordinates of the respective center positions of the suction 4 of the first mounting head 3 are shown in FIG. 1. Referring to FIG. 1, point $P_1$ shows the center position of the sucking face 4a in an original state, and point $P_2$ shows the center position of the sucking face 4a wherein the suction 4 is rotated by 45°. In the same manner, the point $P_3$ shows the center position of the sucking face 4a which is rotated by 90°. The respective points $P_1$, $P_2$, $P_3$, $P_4$, $P_5$, $P_6$, $P_7$ and $P_8$ are on a circle R, and the center of the circle R shows the rotation center of the suction 4. The above-mentioned process is shown by a flow chart as shown in FIG. 2.

In the flow chart, "K" designates the number of 45° rotations. A mark "i" designates the number of the suction 4. The memory area is cleared in step (1), and numeral 1 is set as "K" and "i" in step (2) and (3), respectively. A coordinate (xi, yi) designating center Pi of the sucking face 4a is detected in step (4). The data of the coordinate (xi, yi) is memorized and accumulated in the memory area in step (5). The rotary table 5 then is rotated in step (6). The first suction 4 is rotated by 45° in step (7). The mark "i" is then incremented in step (8). Step (4)–step (9) are repeated eight times. When "i" reaches 9 at step (9), the process goes to step (10), where K is incremented until K=9 (step 11)); memorized data in the memory area is calculated in step (12). before proceeding to the next step (13). As a result, the rotational center of the suction 4 is obtainable from the average.

Figure 3:
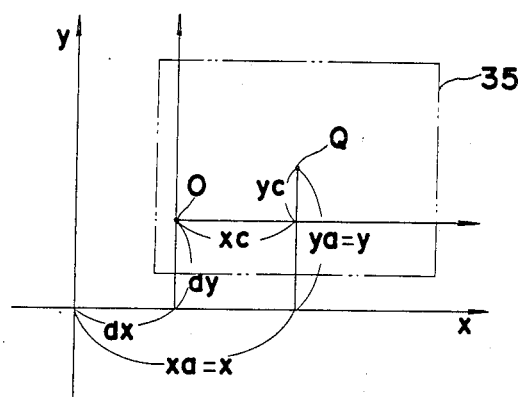
FIG. 3(a), FIG. 3(b), FIG. 3(c) and FIG. 3(d) are rectangular coordinates for showing the correction of deviation of a position of a part in a mounting step thereof.
Figure 3:
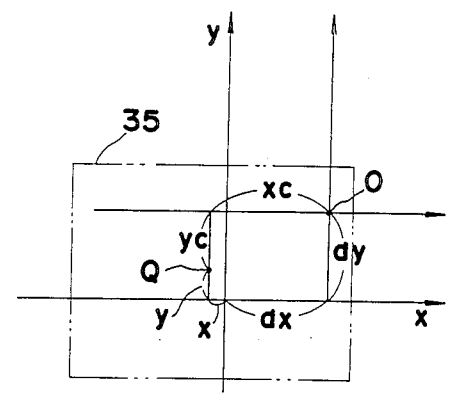
Figure 3:
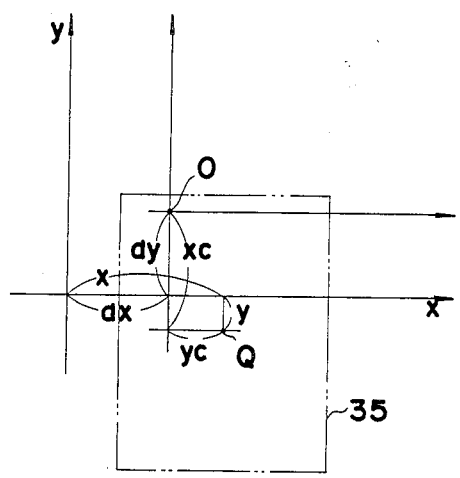
Figure 3:
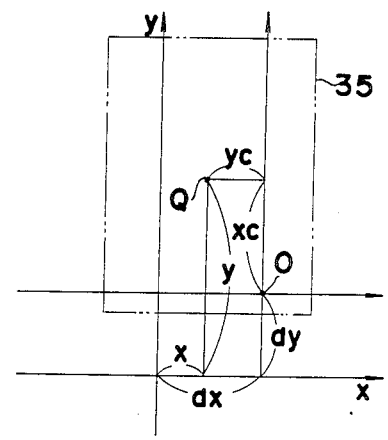

In case a part is sucked on a deviated position of the sucking face 4a, correction of the deviation is accomplished as shown in FIG. 3(a)–FIG. 3(d). Referring to FIG. 3(a), the rotation center O of the suction 4 is positioned at a coordinate (dx, dy), wherein the origin of coordinate axes is at the center of the parts detecting device 6. In FIG. 3(a), center Q of the parts 35 is expressed by a coordinate (xa, ya), and the center Q is also expressed by a coordinate (xc, yc), if the rotation center O is the origin of the coordinate axes. Furthermore, a reference position of the parts detecting device 6 rightly corresponds to a reference position of the circuit board 9 mounted on the positioning table 8.

In the above-mentioned case, if the direction of the parts 35 is not changed, corrections of amount xa (=dx+xc) on the x axis and amount ya (=dy+yc) on the y axis are capable of accurate mounting of the parts 35 onto a predetermined position of the circuit board 9. On the other hand, in case the parts 35 are rotated by 90° in a clockwise direction prior to mounting on the circuit board 9, as shown in FIG. 3(b), the amounts of corrections in the x axis and y axis become (dx+yc) and (dy−xc), respectively. Furthermore, when the parts are rotated by 180° clockwise, as shown in FIG. 3(c), the amounts of correction become (dx−xc) and (dy−yc), respectively. On the other hand, when the parts are further rotated by 90° counterclockwise, as shown in FIG. 3(d), the amount x and y of compensation becomes (dx−yc) and (dy+xc), respectively. Hence, when the part 35 is mounted on the circuit board 9, the part is accurately mounted on a predetermined position of the circuit board by the above-mentioned compensation of the eccentricity.

Figure 8:
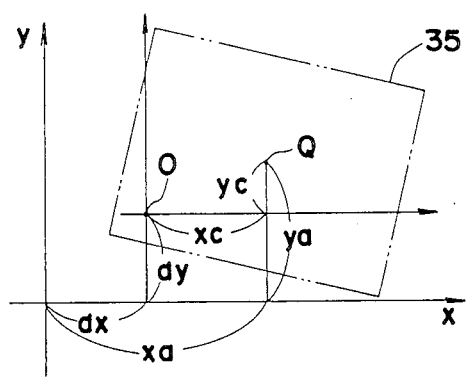
FIG. 8 is a rectangular coordinate for showing the correction of deviation of a position of parts which are obliquely sucked.

Generally, in case the parts are rotated by an optional angle $\theta$ with respect to a coordinate (xc, yc) wherein the origin thereof is the rotating center O of the parts, as shown in FIG. 8, the coordinate (xe, ye) with respect to the origin at the rotation center O of the parts is expressed by the following equation:

$$xe = R \cos(\tan^{-1} yc/xc - \theta)$$

$$ye = R \sin(\tan^{-1} ye/xc - \theta).$$

The amount of x and y correction are shown by (dx+xe) and (dy+ye), respectively. A distance between the rotation center O and the center Q of the parts is expressed by $R (=\sqrt{xc^2 + yc^2})$. The clockwise rotation angle $\theta$ is defined as a positive value in the above equations.

In the above-mentioned embodiment, in order to detect the rotation center O of the suction 4, the suction 4 is rotated by the rotating device 7 which is disposed on the parts direction adjusting station D. However, the rotation center O can be detected by rotation of 360° of the suction 4 at the parts detecting station C. In this case, the respective mounting heads 3 need to be provided with rotation devices thereon. However, the method for mounting electronic parts in accordance with the present invention may be applied to a mounting apparatus of a linear transfer type or a plane transfer type.

What is claimed is:

1. A method for mounting electronic parts comprising the steps of:
   holding an electronic part with a holding member,
   rotating said holding member by a predetermined angle,
   detecting at least two positions of the center of said holding member after rotation by said predetermined angle,
   calculating a rotation center of said holding member on the basis of said at least two positions of the center and said predetermined rotating angle of said holding member, and
   correcting a mounting position of said electronic part onto a circuit substrate on the basis of the deviation between said center and said calculated rotation center of said holding member.

2. An apparatus for mounting electronic parts, comprising:
   a holding member for holding an electronic part,
   rotating means for rotating said holding member by a predetermined angle,
   detecting means for detecting at least two positions of the center of said holding member after rotation by said predetermined angle,
   calculating means for finding a rotation center of said holding member on the basis of said at least two positions of the center and said predetermined rotating angle of said holding member, and
   correcting means for correcting a mounting position of said electronic part onto a circuit substrate on the basis of the deviation between said center and said calculated rotation center of said holding member.

* * * * *